United States Patent
Inoue et al.

(10) Patent No.: US 10,294,062 B2
(45) Date of Patent: May 21, 2019

(54) DETERMINING METHOD, MEASURING APPARATUS, AND ADHESIVE TAPE ATTACHING APPARATUS

(71) Applicant: DISCO CORPORATION, Tokyo (JP)

(72) Inventors: Atsushi Inoue, Tokyo (JP); Hiroyuki Sakaguchi, Tokyo (JP); Kenta Onishi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/883,718

(22) Filed: Jan. 30, 2018

(65) Prior Publication Data

US 2018/0215571 A1 Aug. 2, 2018

(30) Foreign Application Priority Data

Jan. 31, 2017 (JP) ................................. 2017-015094

(51) Int. Cl.
| | |
|---|---|
| *H01L 21/68* | (2006.01) |
| *B65H 35/00* | (2006.01) |
| *G01R 5/06* | (2006.01) |
| *G01L 5/06* | (2006.01) |
| *H01L 21/683* | (2006.01) |

(52) U.S. Cl.
CPC ............ *B65H 35/0033* (2013.01); *G01L 5/06* (2013.01); *H01L 21/6836* (2013.01)

(58) Field of Classification Search
CPC ....... G01L 5/06; B65H 35/0033; B65H 63/02; B65H 63/028
See application file for complete search history.

(56) References Cited

U.S. PATENT DOCUMENTS

| | | | | |
|---|---|---|---|---|
| 2002/0024883 | A1* | 2/2002 | Odashima | ......... H01L 21/67144 365/52 |
| 2009/0215246 | A1* | 8/2009 | Kitahara | .................... C09J 5/06 438/463 |

FOREIGN PATENT DOCUMENTS

JP    2009-076773 A    4/2009

OTHER PUBLICATIONS

Translation of JP 2009-076773, Apr. 4 2009, Disco Abrasive Syst Ltd, Sato Masami, Suma Tsutomu (Year: 2009).*

* cited by examiner

*Primary Examiner* — George R Koch
(74) *Attorney, Agent, or Firm* — Greer Burns & Crain Ltd.

(57) ABSTRACT

A determining method for determining whether or not the tension of an adhesive tape constituting a frame unit is proper, in which a plate-shaped workpiece and an annular frame are attached to the adhesive tape to form the frame unit, is provided. The adhesive tape is composed of a base layer and an adhesive layer formed on the base layer. The determining method includes a supporting step, a downward amount measuring step, and a determining step.

3 Claims, 7 Drawing Sheets

DETERMINING METHOD, MEASURING APPARATUS, AND ADHESIVE TAPE ATTACHING APPARATUS

BACKGROUND OF THE INVENTION

Field of the Invention

The present invention relates to a determining method for determining whether or not the tension of an adhesive tape constituting a frame unit is proper, a measuring apparatus suitable for this determining method, and an adhesive tape attaching apparatus including this measuring apparatus.

Description of the Related Art

In a semiconductor device fabrication process or the like, a wafer is divided into plural chips by using a cutting apparatus or a laser processing apparatus, for example. The cutting apparatus includes a cutting unit rotating an annular cutting blade. The laser processing apparatus includes a laser beam applying unit applying and focusing a laser beam. By relatively moving the cutting unit or the laser beam applying unit and the wafer as cutting the wafer with the cutting blade being rotated or as applying the laser beam to the wafer, the wafer can be processed along a path of this relative movement.

In processing a plate-shaped workpiece such as a wafer by using the cutting apparatus or the laser processing apparatus as mentioned above, the workpiece is fixed through an adhesive tape to an annular frame to thereby form a frame unit in many cases, in which a central portion of the adhesive tape larger in diameter than the workpiece is attached to the workpiece, and a peripheral portion of the adhesive tape is attached to the frame (see Japanese Patent Laid-open No. 2009-76773, for example). By forming such a frame unit, the workpiece can be protected from any shock in transferring or processing the workpiece. In addition, the ease of handling of the workpiece after processing can be improved.

SUMMARY OF THE INVENTION

When the tension of the adhesive tape constituting the frame unit is weak (low), there is a possibility that the chips obtained by dividing the workpiece may come into contact with each other during transfer, causing damage to the chips. Conversely, when the tension of the adhesive tape is strong (high), there is a possibility that a strong force expanding the adhesive tape may act on the workpiece during dividing the workpiece, causing the occurrence of chipping of the chips. Accordingly, it is necessary to properly control the tension of the adhesive tape.

Conventionally, an operator (person in charge of determination) flicks the adhesive tape constituting the frame unit with a finger or the like and then determines whether or not the tension of the adhesive tape is proper, according to the sound or feel from the adhesive tape. Accordingly, there is a case that the accuracy of determination may be reduced depending on the experience or ability of the operator.

It is therefore an object of the present invention to provide a determining method which can reliably determine whether or not the tension of an adhesive tape constituting a frame unit is proper.

It is another object of the present invention to provide a measuring apparatus suitable for this determining method.

It is a further object of the present invention to provide an adhesive tape attaching apparatus including this measuring apparatus.

In accordance with an aspect of the present invention, there is provided a determining method for determining whether or not the tension of an adhesive tape constituting a frame unit is proper, the frame unit being configured by uniting a plate-shaped workpiece and an annular frame through the adhesive tape, the adhesive tape being composed of a base layer and an adhesive layer formed on the base layer, the workpiece being attached to a central portion of the adhesive layer of the adhesive tape, the frame being attached to a peripheral portion of the adhesive layer of the adhesive tape so as to surround the workpiece in spaced relationship therewith, the determining method including a supporting step of supporting the workpiece and the frame in the condition where the base layer of the adhesive tape is exposed upward and a space is defined between the workpiece and the frame below the adhesive tape; a downward amount measuring step of placing a weight on the adhesive tape at the position corresponding to the space and then measuring a downward amount corresponding to the tension of the adhesive tape according to the height of the weight with reference to the height of the adhesive tape at the position corresponding to the workpiece and the height of the adhesive tape at the position corresponding to the frame; and a determining step of determining that the tension of the adhesive tape is proper when the downward amount falls within a predetermined range, whereas determining that the tension of the adhesive tape is improper when the downward amount falls outside the predetermined range.

Preferably, the downward amount is measured at a plurality of positions on the adhesive tape corresponding to the space in the downward amount measuring step; and variations in the tension of the adhesive tape are evaluated according to the difference in the downward amount measured at the plurality of positions in the determining step. Preferably, the weight is a gauge head of a dial gauge.

In accordance with another aspect of the present invention, there is provided a measuring apparatus for measuring the tension of an adhesive tape constituting a frame unit, the frame unit being configured by uniting a plate-shaped workpiece and an annular frame through the adhesive tape, the adhesive tape being composed of a base layer and an adhesive layer formed on the base layer, the workpiece being attached to a central portion of the adhesive layer of the adhesive tape, the frame being attached to a peripheral portion of the adhesive layer of the adhesive tape so as to surround the workpiece in spaced relationship therewith, the measuring apparatus including a support table for supporting the workpiece and the frame in the condition where the base layer of the adhesive tape is exposed upward and a space is defined between the workpiece and the frame below the adhesive tape; a dial gauge having a gauge head adapted to be placed on the adhesive tape at the position corresponding to the space, the dial gauge functioning to measure a downward amount corresponding to the tension of the adhesive tape according to the height of the gauge head; and a gauge fixing member fixing the dial gauge in such a manner that the gauge head vertically movably extends downward from the gauge fixing member, the gauge fixing member being adapted to span the space between the workpiece and the frame.

Preferably, the measuring apparatus further includes a moving unit moving the gauge fixing member so that the dial gauge may be set at a plurality of positions on the adhesive tape corresponding to the space.

In accordance with a further aspect of the present invention, there is provided an adhesive tape attaching apparatus for attaching an adhesive tape to a plate-shaped workpiece and an annular frame to thereby form a frame unit including the workpiece and the frame united through the adhesive tape, the adhesive tape being composed of a base layer and an adhesive layer formed on the base layer, the workpiece being attached to a central portion of the adhesive layer of the adhesive tape, the frame being attached to a peripheral portion of the adhesive layer of the adhesive tape so as to surround the workpiece in spaced relationship therewith, the adhesive tape attaching apparatus including a first support table for supporting the workpiece and the frame; a tape support member supporting the adhesive tape in the form of a roll; a pressure roller for pressing the adhesive tape against the workpiece and the frame supported on the first support table; a first moving unit relatively moving the first support table and the pressure roller to thereby attach the adhesive layer of the adhesive tape to the workpiece and the frame; and a measuring unit measuring the tension of the adhesive tape in the condition where the adhesive layer of the adhesive tape has been attached to the workpiece and the frame; the measuring unit including a second support table for supporting the workpiece and the frame in the condition where the base layer of the adhesive tape is exposed upward and a space is defined between the workpiece and the frame below the adhesive tape; a dial gauge having a gauge head adapted to be placed on the adhesive tape at the position corresponding to the space, the dial gauge functioning to measure a downward amount corresponding to the tension of the adhesive tape according to the height of the gauge head; and a gauge fixing member fixing the dial gauge in such a manner that the gauge head vertically movably extends downward from the gauge fixing member, the gauge fixing member being adapted to span the space between the workpiece and the frame.

Preferably, the measuring unit further includes a second moving unit moving the gauge fixing member so that the dial gauge may be set at a plurality of positions on the adhesive tape corresponding to the space. Preferably, the second support table is the same as the first support table.

In the determining method according to the present invention, the weight is placed on the adhesive tape and the downward amount corresponding to the tension of the adhesive tape is then measured. Thereafter, when the downward amount measured falls within a predetermined range, it is determined that the tension of the adhesive tape is proper, whereas when the downward amount measured falls outside the predetermined range, it is determined that the tension of the adhesive tape is improper. Accordingly, there is no possibility that the result of the determination may vary according to the operator (the person in charge of the determination) as in the prior art. That is, according to the determining method described above, it is possible to reliably determine whether or not the tension of the adhesive tape constituting the frame unit is proper.

Further, the measuring apparatus and the adhesive tape attaching apparatus according to the present invention each include the support table for supporting the workpiece and the frame so that the space is defined between the workpiece and the frame below the adhesive tape and also includes the dial gauge having the gauge head adapted to be placed on the adhesive tape at the position corresponding to the space, in which the dial gauge functions to measure the downward amount corresponding to the tension of the adhesive tape according to the height of the gauge head. Accordingly, the determining method according to the present invention can be suitably performed by using the measuring apparatus or the adhesive tape attaching apparatus mentioned above.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. A determining method according to this preferred embodiment is used to determine whether or not the tension of an adhesive tape constituting a frame unit is proper. This determining method includes a supporting step (see FIG. 5A), a downward amount measuring step (see FIG. 5B), and a determining step. The supporting step is the step of supporting a workpiece and an annular frame constituting the frame unit in the condition where the base layer of the adhesive tape is exposed upward and a space is defined between the workpiece and the frame below the adhesive tape. The downward amount measuring step is the step of placing the gauge head (weight) of a dial gauge on the adhesive tape at the position corresponding to the space mentioned above and then measuring a downward amount corresponding to the tension of the adhesive tape according to the height of the gauge head with reference to the height of the adhesive tape in the area attached to the workpiece and the height of the adhesive tape in the area attached to the frame. The determining step is the step of determining that the tension of the adhesive tape is proper when the downward amount measured in the downward amount measuring step falls within a predetermined range, whereas determining that the tension of the adhesive tape is improper when the downward amount measured in the downward amount measuring step falls outside the predetermined range. The determining method according to this preferred embodiment will now be described in more detail.

Figure 1A:
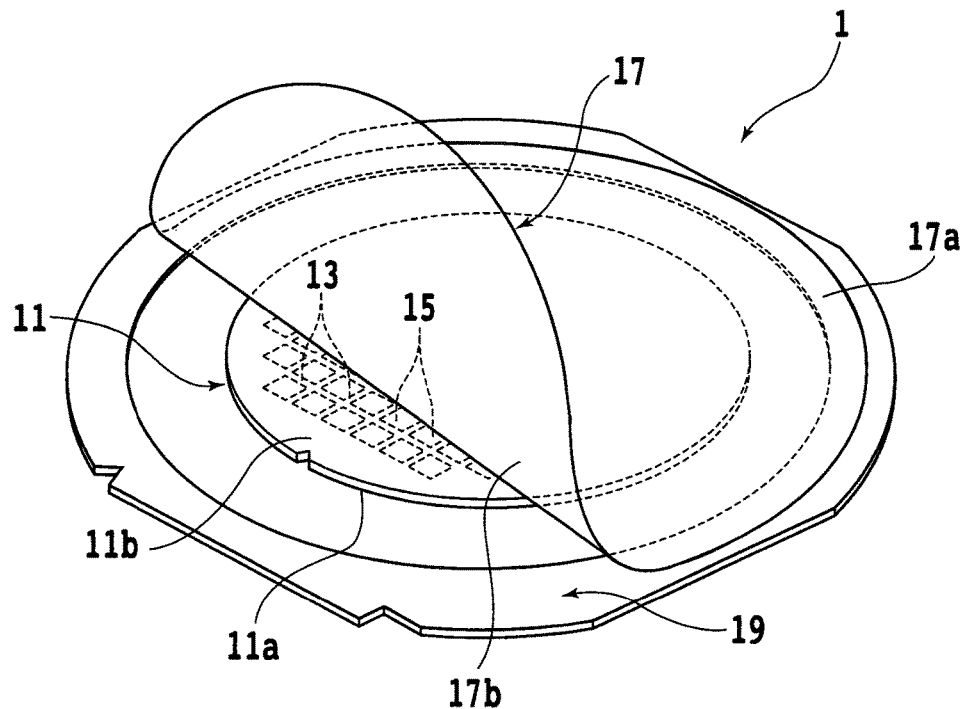
FIG. 1A is a schematic perspective view showing a manner of forming a frame unit.
Figure 1B:
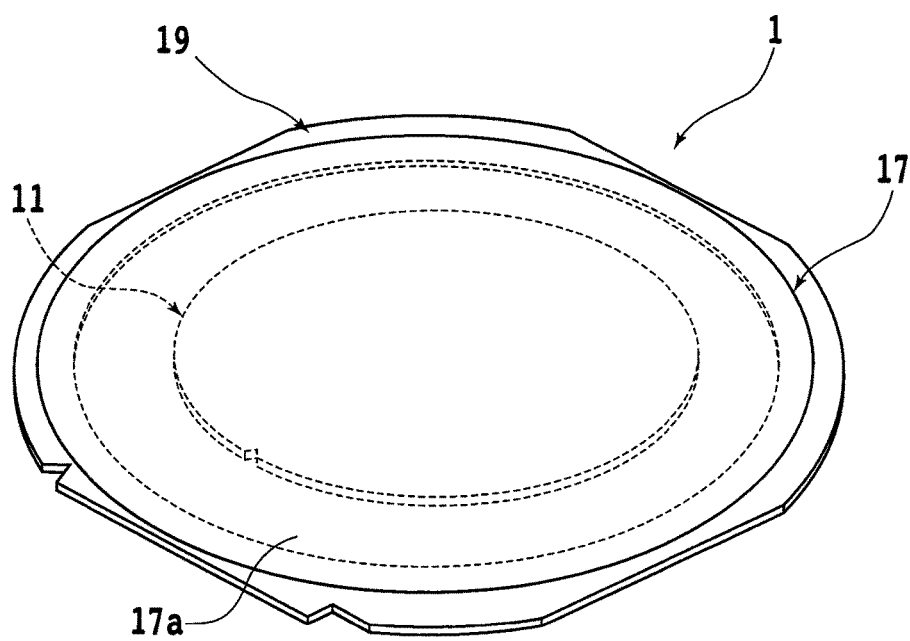
FIG. 1B is a schematic perspective view of the frame unit in its completed condition.

There will first be described the configuration of the frame unit as an object to be determined by the determining method according to this preferred embodiment. FIG. 1A is a schematic perspective view showing a manner of forming a frame unit 1, and FIG. 1B is a schematic perspective view of the frame unit 1 in its completed condition. The frame unit 1 includes a workpiece 11 to be processed by a cutting apparatus (not shown) or a laser processing apparatus (not shown), for example. The workpiece 11 is a disk-shaped wafer formed of silicon (Si), silicon carbide (SiC), or sapphire ($Al_2O_3$), for example. The workpiece 11 has a front side 11a and a back side 11b. The front side 11a of the workpiece 11 is partitioned by a plurality of crossing division lines (streets) 13 to define a plurality of separate regions where a plurality of devices 15 such as ICs (integrated circuits) and LEDs (light emitting diodes) are each formed. While the workpiece 11 is a disk-shaped wafer formed of silicon, silicon carbide, or sapphire, for example, in this preferred embodiment, the workpiece 11 is not limited in material, shape, structure, size, etc. For example, the workpiece 11 may be a substrate formed of any other semiconductors, ceramic, resin, metal, etc. Further, the devices 15 are not limited in kind, number, size, arrangement, etc.

As shown in FIG. 1A, a circular adhesive tape 17 is attached to the back side 11b of the workpiece 11. The adhesive tape 17 is composed of a base layer 17a and an adhesive layer 17b formed on the base layer 17a. The base layer 17a is formed of polyolefin, polyethylene terephthalate, polyvinyl chloride, or polystyrene, for example. The adhesive layer 17b is formed of silicone rubber, acrylic resin, or epoxy resin, for example. The adhesive layer 17b of the adhesive tape 17 is attached at its central portion to the back side 11b of the workpiece 11. As shown in FIG. 1A, a peripheral portion of the adhesive layer 17b of the adhesive tape 17 is attached (fixed or mounted) to an annular frame 19 in such a manner that the workpiece 11 is surrounded by the annular frame 19 so as to be spaced therefrom. As a result, the workpiece 11 and the frame 19 are united through the adhesive tape 17 to thereby complete the frame unit 11 as shown in FIG. 1B. While the base layer 17a is formed of polyolefin, polyethylene terephthalate, polyvinyl chloride, or polystyrene, for example, in this preferred embodiment, the material of the base layer 17a is not limited. Further, while the adhesive layer 17b is formed of silicone rubber, acrylic resin, or epoxy resin, for example, in this preferred embodiment, the material of the adhesive layer 17b is not limited. Further, the adhesive tape 17 is not limited in material, shape, structure, size, etc. Further, the frame 19 is also not limited in material, shape, structure, size, etc.

Figure 2:
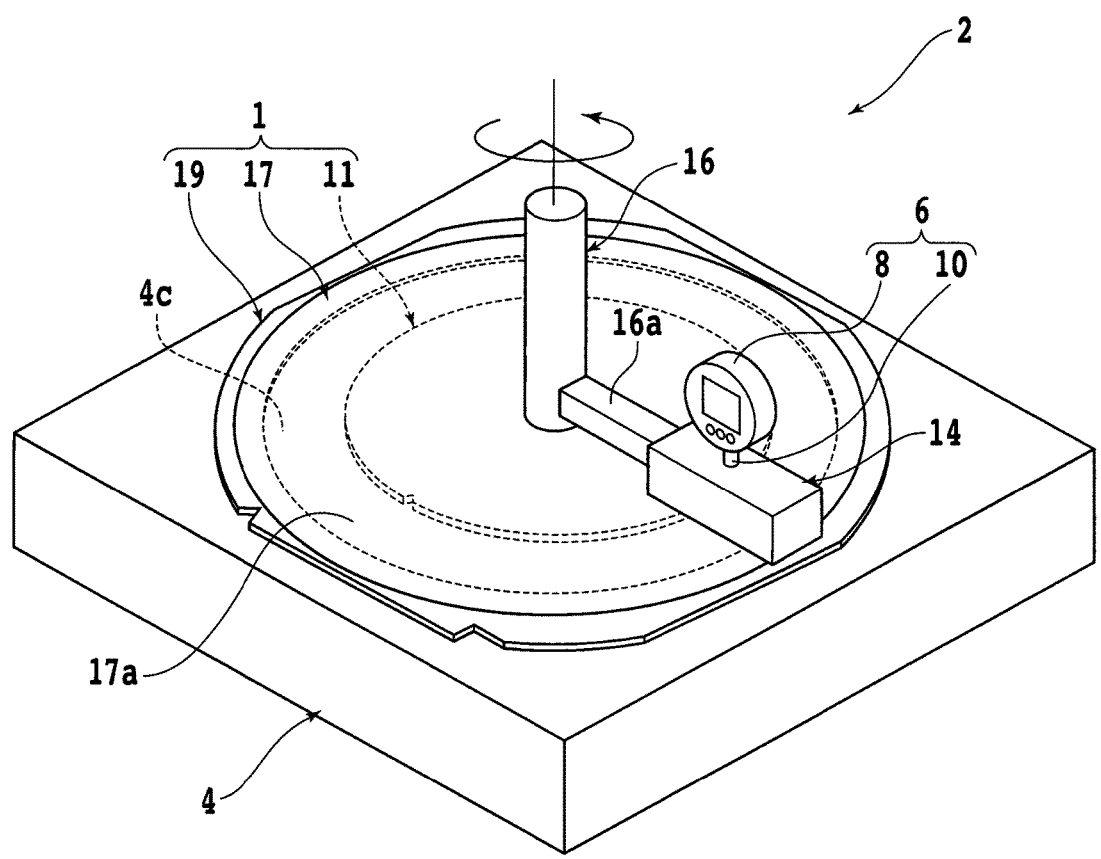
FIG. 2 is a schematic perspective view of a measuring apparatus for use in performing a determining method according to a preferred embodiment of the present invention.
Figure 3:
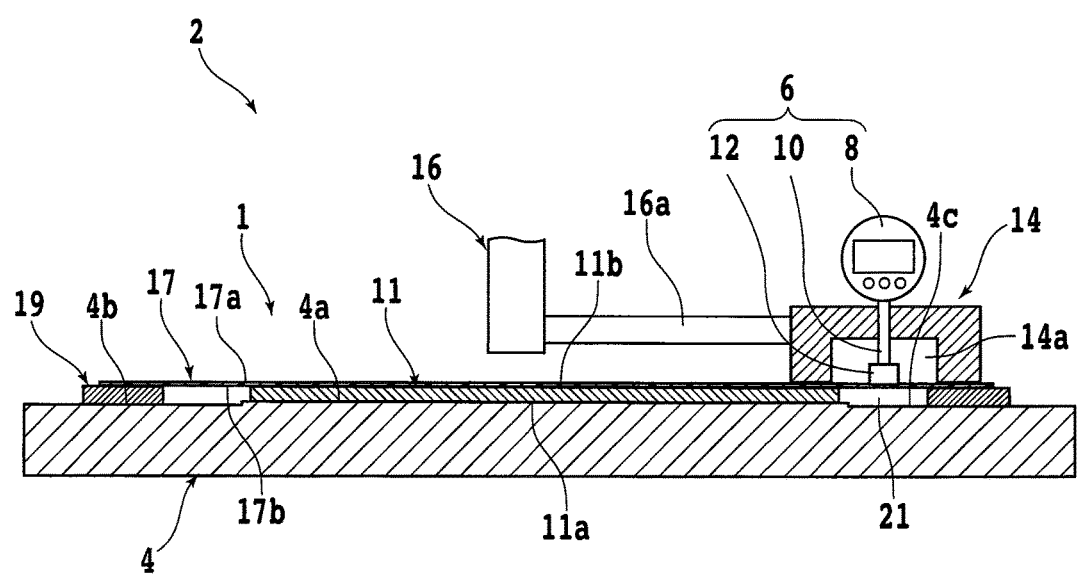
FIG. 3 is a partially sectional side view of the measuring apparatus shown in FIG. 2.

There will now be described a measuring apparatus (measuring unit) to be used in the determining method according to this preferred embodiment. FIG. 2 is a schematic perspective view of a measuring apparatus (measuring unit) 2, and FIG. 3 is a partially sectional side view of the measuring apparatus 2 shown in FIG. 2. As shown in FIGS. 2 and 3, the measuring apparatus 2 includes a support table (first support table or second support table) 4 for supporting the frame unit 1. The support table 4 has an upper surface for supporting the frame unit 1. The upper surface of the support table 4 includes a workpiece support area 4a having a shape corresponding to the shape of the workpiece 11 and a frame support area 4b surrounding the workpiece support area 4a. In this preferred embodiment, the workpiece support area 4a is circular as viewed in plan, and the frame support area 4b is annular as viewed in plan. In supporting the frame unit 11 on the support table 4, the workpiece 11 is placed on the workpiece support area 4a and the frame 19 is placed on the frame support area 4b in the condition where the base layer 17a of the adhesive tape 17 is exposed upward. Further, an annular area 4c is defined between the workpiece support area 4a and the frame support area 4b, in which neither the workpiece 11 nor the frame 19 is placed on the annular area 4c. Accordingly, when the frame unit 1 is supported on the support table 4, an annular space 21 is defined above the annular area 4c so as to be surrounded by the workpiece 11, the adhesive tape 17, and the frame 19. In other words, the annular space 21 is defined below the adhesive tape 17 between the workpiece 11 and the frame 19.

As shown in FIG. 3, the workpiece 11 is thinner than the frame 19 in this preferred embodiment. Accordingly, the workpiece support area 4a is set higher in level than the frame support area 4b in order that the height of the upper surface (typically, the back side 11b) of the workpiece 11 placed on the workpiece support area 4a becomes substantially equal to the height of the upper surface of the frame 19 placed on the frame support area 4b. However, the levels of the workpiece support area 4a and the frame support area 4b may be arbitrarily set or changed according to the thicknesses of the workpiece 11 and the frame 19.

Figure 4:
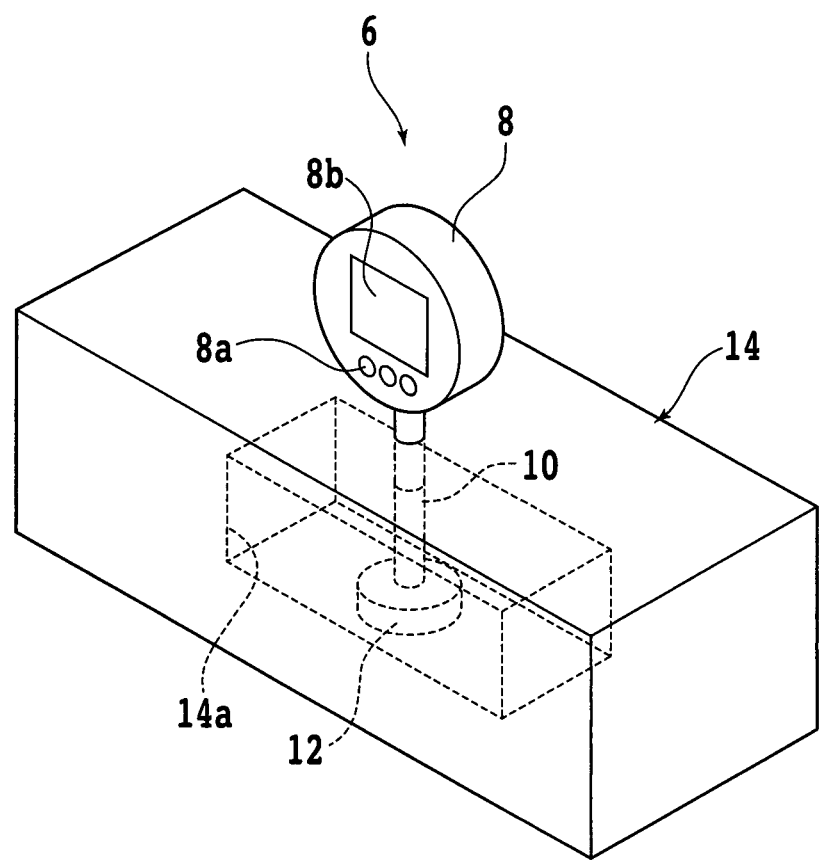
FIG. 4 is an enlarged perspective view of an essential part of the measuring apparatus shown in FIG. 2.

As shown in FIGS. 2 and 3, a dial gauge 6 is located above the annular area 4c defined between the workpiece support area 4a and the frame support area 4b. FIG. 4 is an enlarged perspective view of the dial gauge 6 and its periphery. As shown in FIGS. 2, 3, and 4, the dial gauge 6 includes a disk-shaped housing 8, a vertically movable rod 10 having an upper end inserted in the housing 8, and a gauge head (weight) 12 provided at the lower end of the rod 10 and adapted to come into contact with a measurement object. A measuring mechanism (not shown) is provided inside the housing 8 so as to be connected to the upper end of the rod 10. This measuring mechanism functions to measure the position, displacement (amount of movement), etc. of the rod 10 when the gauge head 12 comes into contact with the measurement object. The housing 8 has a front surface, which is provided with operation buttons 8a for receiving various inputs to the dial gauge 6 and a display 8b for displaying information including the position, displacement, etc. measured by the measuring mechanism. The mass (weight) of the gauge head 12 is arbitrarily set according to the kind etc. of the adhesive tape 17 as the measurement object. As a modification, a biasing member such as spring may be provided to apply a downward force to the rod 10. In this case, the downward force by the biasing member can be used in addition to the gravity acting on the gauge head 12, so that the mass of the gauge head 12 can be reduced. Further, while the dial gauge 6 is of a digital type in this preferred embodiment, an analog type dial gauge may also be used. Further, any other measuring instruments having a function similar to the function of a dial gauge may also be used.

The dial gauge 6 is fixed to a gauge fixing member 14 at its upper portion. The gauge fixing member 14 is a rectangular prismatic shape having a size extending from the workpiece support area 4a to the frame support area 4b. That is, the gauge fixing member 14 is adapted to span the annular area 4c between the workpiece support area 4a and the frame support area 4b. The dial gauge 6 is fixed to the gauge fixing member 14 in such a manner that the rod 10 and the gauge head 12 vertically movably extend downward from the gauge fixing member 14. That is, the rod 10 and the gauge head 12 of the dial gauge 6 are movable relative to the gauge fixing member 14. The lower surface of the gauge fixing member 14 is formed with a recess 14a. The recess 14a is so formed as to allow the vertical movement of the rod 10 and the gauge head 12. Prior to starting the measurement, the lower surface of the gauge head 12 is adjusted to a level lower than the level of the lower surface of the gauge fixing member 14. Further, prior to starting the measurement, a reference level for the lower surface of the gauge head 12 is set (reference position or zero position setting). For example, the reference level may be set in the following manner. The gauge fixing member 14 is first placed on the upper surface of a flat bed. Thereafter, the lower surface of the gauge head 12 is brought into contact with the upper surface of the flat bed. In this condition, the level of the lower surface of the gauge head 12 (i.e., this level being the same as the level of the lower surface of the gauge fixing member 14) is set as the reference level, or the reference position. As a modification, in the condition where the rod 10 is moved to the lowermost position by the gravity acting on the gauge head 12 (i.e., in the condition where the gauge head 12 is spaced at the maximum distance from the housing 8), the level of the lower surface of the gauge head 12 may be set as the reference level.

A gauge moving unit (second moving unit) 16 having an arm 16a is provided to move the gauge fixing member 14 and the dial gauge 6 together. The arm 16a of the gauge moving unit 16 is connected to the side surface of the gauge fixing member 14. The gauge moving unit 16 includes a rotational drive source such as a motor for rotating the arm 16a about a vertical axis to thereby move the dial gauge 6 along the annular area 4c between the workpiece support area 4a and the frame support area 4b. Accordingly, the dial gauge 6 can be set at plural positions corresponding to the annular space 21 formed above the annular area 4c, and the tension of the adhesive tape 17 can be checked at each position by the dial gauge 6. The gauge moving unit 16 is vertically movable, so that it can be retracted upward in placing the frame unit 1 on the support table 4 or removing the frame unit 1 from the support table 4.

Figure 5A:
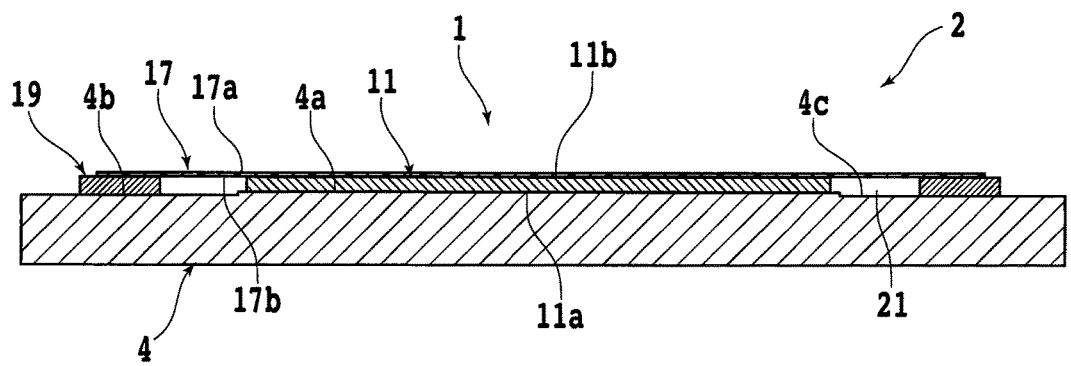
FIG. 5A is a partially sectional side view for illustrating a supporting step in the determining method according to this preferred embodiment.

The determining method using the measuring apparatus 2 will now be described. First, the supporting step is performed in the following manner. The workpiece 11 and the frame 19 constituting the frame unit 1 are supported on the support table 4 in the condition where the base layer 17a of the adhesive tape 17 uniting the workpiece 11 and the frame 19 is exposed upward and the annular space 21 is defined between the workpiece 11 and the frame 19 below the adhesive tape 17. FIG. 5A is a partially sectional side view for illustrating the supporting step. As shown in FIG. 5A, the workpiece 11 is placed on the workpiece support area 4a of the support table 4, and the frame 19 is placed on the frame support area 4b of the support table 4 in the condition where the base layer 17a of the adhesive tape 17 is exposed upward. That is, the workpiece 11 and the frame 19 are not placed on the annular area 4c formed between the workpiece support area 4a and the frame support area 4b. As a result, the annular space 21 is defined above the annular area 4c so as to be surrounded by the workpiece 11, the adhesive tape 17, and the frame 19. Optionally, a protective tape or the like may be previously attached to the front side 11a of the workpiece 11.

Figure 5B:
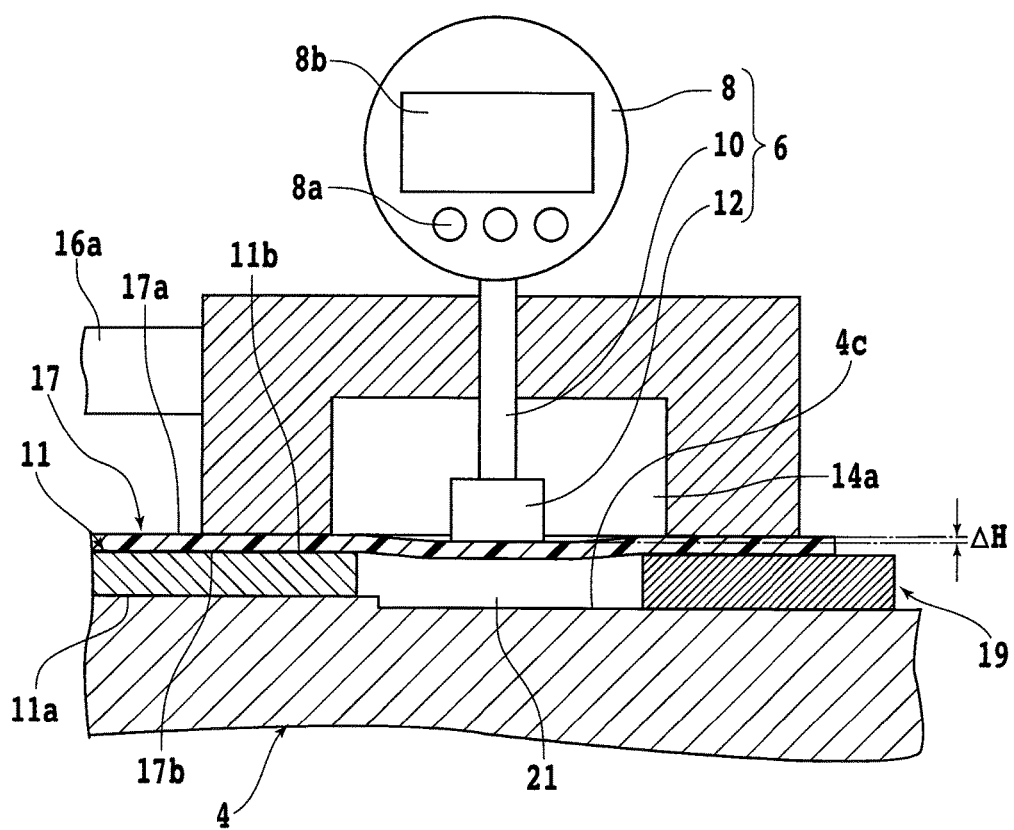
FIG. 5B is a partially sectional side view for illustrating a downward amount measuring step in the determining method.

After performing the supporting step, the downward amount measuring step is performed in the following manner. First, the gauge head 12 is placed on the adhesive tape 17 at the position corresponding to the annular space 21. In this condition, the downward amount corresponding to the tension of the adhesive tape 17 is measured according to the height of the gauge head 12 with reference to the height of the adhesive tape 17 at the position corresponding to the workpiece 11 and the height of the adhesive tape 17 at the position corresponding to the frame 19. FIG. 5B is a partially sectional side view for illustrating the downward amount measuring step. In the downward amount measuring step, the dial gauge 6 is moved to a desired position where it is determined whether or not the tension of the adhesive tape 17 is proper, by using the gauge moving unit 16. More specifically, the dial gauge 6 is moved to any position corresponding to the annular space 21. Thereafter, the lower surface of the gauge fixing member 14 is brought into contact with the base layer 17a (upper surface) of the adhesive tape 17 at the positions above the workpiece 11 and the frame 19 so that the height of the base layer 17a of the adhesive tape 17 at the positions above the workpiece 11 and the frame 19 becomes a reference height for measurement. As mentioned above, the lower surface of the gauge head 12 is previously adjusted to a level lower than the level of the lower surface of the gauge fixing member 14. Accordingly, when the lower surface of the gauge fixing member 14 is brought into contact with the base layer 17a of the adhesive tape 17 at the positions above the workpiece 11 and the frame 19, the gauge head 12 is placed on the base layer 17a of the adhesive tape 17 at the position above the annular space 21. As a result, the adhesive tape 17 at the position above the annular space 21 is depressed downward by the gravity acting on the gauge head 12.

Thereafter, the downward amount of the adhesive tape 17 depressed downward and deformed by the gauge head 12 at the position above the annular space 21 is measured by the dial gauge 6. More specifically, the height of the lower surface of the gauge head 12 is measured with reference to the height of the adhesive tape 17 at the position corresponding to the workpiece 11 and the height of the adhesive tape 17 at the position corresponding to the frame 19. In other words, the difference OH between the reference height (reference position or zero position) and the height of the base layer 17a of the adhesive tape 17 depressed downward and deformed by the gauge head 12 is measured as the downward amount of the adhesive tape 17. The downward amount (the difference OH) measured above corresponds to the tension of the adhesive tape 17. In the case that the height of the lower surface of the gauge head 12 is set as the reference height in the condition where the rod 10 is moved to the lowermost position, an upward amount of the lower surface of the gauge head 12 from the reference height is calculated. Accordingly, the above downward amount (or the amount corresponding to the downward amount) can be calculated according to the upward amount calculated above. In other words, this upward amount measured in this case also corresponds to the tension of the adhesive tape 17.

After performing the downward amount measuring step, the determining step is performed to determine whether or not the tension of the adhesive tape 17 is proper. More specifically, when the downward amount measured in the downward amount measuring step falls within a predetermined range, it is determined that the tension of the adhesive tape 17 is proper. Conversely, when the downward amount measured in the downward amount measuring step falls outside the predetermined range, it is determined that the tension of the adhesive tape 17 is improper. This predetermined range as a criterion of determination is arbitrarily set or changed according to the kind etc. of the adhesive tape 17. As a modification, it may be determined whether the tension of the adhesive tape 17 is strong or weak (i.e., whether the tension of the adhesive tape 17 is higher or lower than a proper range) in the determining step. For example, when the downward amount measured in the downward amount measuring step is lower than the predetermined range, it is determined that the tension of the adhesive tape 17 is strong (i.e., higher than the proper range). Conversely, when the downward amount measured in the downward amount measuring step is higher than the predetermined range, it is determined that the tension of the adhesive tape 17 is weak (i.e., lower than the proper range). In the case that the tension of the adhesive tape 17 is determined to be strong in the determining step, it is preferable to subsequently change the conditions for attachment of the adhesive tape 17 so that the tension of the adhesive tape 17 is decreased. Conversely, in the case that the tension of the adhesive tape 17 is determined to be weak in the determining step, it is preferable to subsequently change the conditions for attachment of the adhesive tape 17 so that the tension of the adhesive tape 17 is increased.

In the determining method according to this preferred embodiment as described above, the gauge head (weight) 12 is placed on the adhesive tape 17 and the downward amount corresponding to the tension of the adhesive tape 17 is then measured. Thereafter, when the downward amount measured falls within a predetermined range, it is determined that the tension of the adhesive tape 17 is proper, whereas when the downward amount measured falls outside the predetermined range, it is determined that the tension of the adhesive tape 17 is improper. Accordingly, there is no possibility that the result of the determination may vary according to the operator (the person in change of the determination) as in the prior art. That is, according to the determining method described above, it is possible to reliably determine whether or not the tension of the adhesive tape 17 constituting the frame unit 1 is proper.

Further, the measuring apparatus (measuring unit) 2 according to this preferred embodiment includes the support table 4 for supporting the workpiece 11 and the frame 19 so that the annular space 21 is defined between the workpiece 11 and the frame 19 below the adhesive tape 17 and also includes the dial gauge 6 having the gauge head 12 adapted to be placed on the adhesive tape 17 at the position corresponding to the annular space 21, in which the dial gauge 6 functions to measure the downward amount corresponding to the tension of the adhesive tape 17 according to the height of the gauge head 12. Accordingly, the determining method according to this preferred embodiment can be suitably performed by using this measuring apparatus 2.

Figure 6:
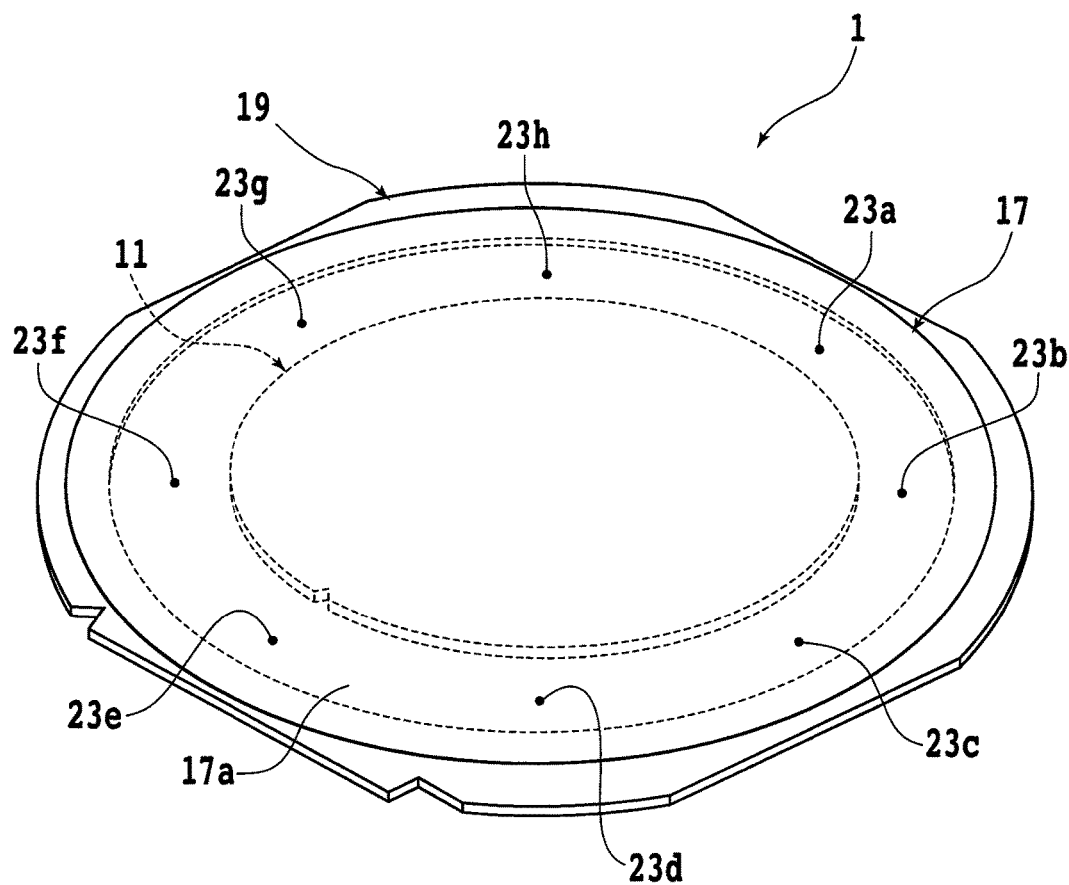
FIG. 6 is a perspective view showing a plurality of positions where a downward amount is measured in a downward amount measuring step according to a modification.

The present invention is not limited to the above preferred embodiment, but various modifications may be made. For example, the measurement of the downward amount in the downward amount measuring step may be performed at two or more positions. FIG. 6 is a perspective view showing a plurality of positions where the downward amount is measured in the downward amount measuring step according to a modification. More specifically, in this modification shown in FIG. 6, the downward amount is measured at eight positions 23a, 23b, 23c, 23d, 23e, 23f, 23g, and 23h corresponding to the annular space 21 in the downward amount measuring step. A plurality of measured values for the downward amount as obtained at these plural positions 23a to 23h are used in the determining step subsequent to the downward amount measuring step, so that the condition of the tension of the adhesive tape 17 can be checked in more detail. For example, variations in the tension of the adhesive tape 17 can be evaluated according to the difference in the downward amount measured at the plural positions 23a to 23h.

Further, the kind of the adhesive tape can be determined by applying the determining method according to this preferred embodiment or the modification. For example, a first range is set for the downward amount corresponding to an adhesive tape having a base layer formed of polyolefin, and a second range is set for the downward amount corresponding to an adhesive tape having a base layer formed of polyethylene terephthalate. In this case, it can be determined which of the adhesive tape having the base layer of polyolefin and the adhesive tape having the base layer of polyethylene terephthalate is in use.

Figure 7:
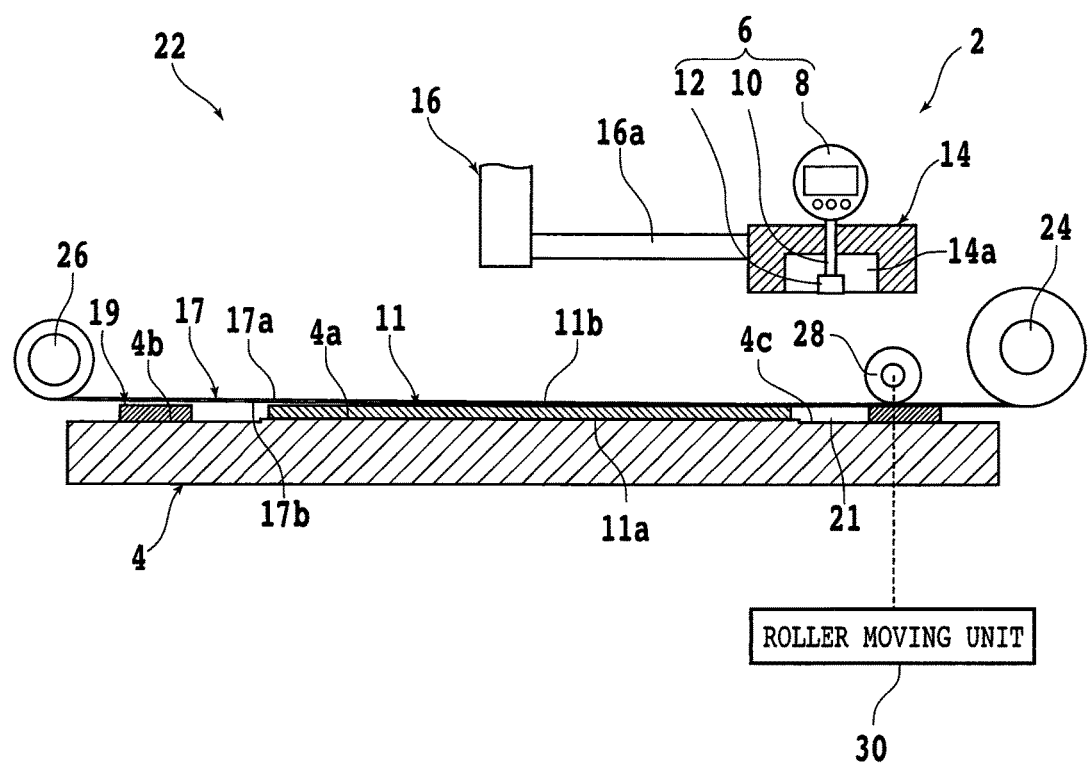
FIG. 7 is a partially sectional side view schematically showing the configuration of an adhesive tape attaching apparatus including the measuring apparatus shown in FIGS. 2 to 4.

Further, the measuring apparatus 2 may be incorporated in an adhesive tape attaching apparatus or the like. FIG. 7 is a partially sectional side view schematically showing the configuration of an adhesive tape attaching apparatus 22 including the measuring apparatus 2. As shown in FIG. 7, the measuring apparatus 2 according to the above preferred embodiment is incorporated in the adhesive tape attaching apparatus 22. The detailed description of the measuring apparatus 2 will be omitted herein. A cylindrical supply roller (tape support member) 24 for supporting a belt-shaped adhesive tape 17 is located above the support table 4. The supply roller 24 is connected to a rotational drive source (not shown) such as a motor, so that the supply roller 24 is adapted to be rotated about a predetermined axis by a force generated from the rotational drive source. The belt-shaped adhesive tape 17 is wrapped around a cylindrical tube (not shown) in such a manner that the adhesive layer 17b of the adhesive tape 17 is oriented outward. The supply roller 24 is inserted in the inside space formed inside the cylindrical tube. Thus, the adhesive tape 17 in the form of a roll is supported to the supply roller 24.

A take-up roller 26 is located apart from the supply roller 24 in a horizontal direction, so as to take up the adhesive tape 17 supplied from the supply roller 24. The take-up roller 26 is connected to a rotational drive source (not shown) such as a motor, so that the take-up roller 26 is adapted to be rotated about a predetermined axis by a force generated from this rotational drive source. The axis of rotation of the take-up roller 26 is substantially parallel to the axis of rotation of the supply roller 24. In attaching the adhesive tape 17 to the workpiece 11 and the frame 19, the adhesive tape 17 supplied from the supply roller 24 is stretched between the supply roller 24 and the take-up roller 26.

A pressure roller 28 is located between the supply roller 24 and the take-up roller 26, so as to press the adhesive tape 17 against the workpiece 11 and the frame 19 supported on the support table 4. The pressure roller 28 is connected to a roller moving unit (first moving unit) 30, so that the pressure roller 28 is adapted to be moved in a direction where the adhesive tape 17 is supplied from the supply roller 24. Accordingly, by moving the pressure roller 28 in pressure contact with the base layer 17a of the adhesive layer 17 stretched between the supply roller 24 and the take-up roller 26, the adhesive layer 17b of the adhesive tape 17 can be pressed on the workpiece 11 and the frame 19, thereby attaching the adhesive tape 17 to the workpiece 11 and the frame 19. As described above, the measuring apparatus 2 is incorporated in the adhesive tape attaching apparatus 22. Accordingly, after attaching the adhesive tape 17 to the workpiece 11 and the frame 19, the downward amount corresponding to the tension of the adhesive tape 17 can be measured by the measuring apparatus 2.

After attaching the adhesive tape 17 to the workpiece 11 and the frame 19 or after measuring the downward amount corresponding to the tension of the adhesive tape 17, the adhesive tape 17 may be cut according to the shape, size, etc.

of the frame 19. As a result, the frame unit 1 mentioned above can be completed. As a modification, the adhesive tape 17 may be previously cut according to the shape, size, etc. of the frame 19. Further, the downward amount corresponding to the tension of the adhesive tape 17 may be measured after cutting the adhesive tape 17.

In the case that the tension of the adhesive tape 17 is determined to be strong according to the downward amount measured, the conditions for the operation of each component of the adhesive tape attaching apparatus 22 may be changed so as to decrease the tension of the adhesive tape 17. For example, by increasing the supply amount of the adhesive tape 17 to be supplied from the supply roller 24 or by decreasing the take-up amount of the adhesive tape 17 to be taken up by the take-up roller 26, the tension of the adhesive tape 17 can be decreased. Similarly, in the case that the tension of the adhesive tape 17 is determined to be weak according to the downward amount measured, the conditions for the operation of each component of the adhesive tape attaching apparatus 22 may be changed so as to increase the tension of the adhesive tape 17. For example, by decreasing the supply amount of the adhesive tape 17 to be supplied from the supply roller 24 or by increasing the take-up amount of the adhesive tape 17 to be taken up by the take-up roller 26, the tension of the adhesive tape 17 can be increased.

Further, while the pressure roller 28 is moved without moving the support table 4 in the adhesive tape attaching apparatus 22 according to this preferred embodiment, the support table 4 and the pressure roller 28 may be relatively moved in the present invention.

In the adhesive tape attaching apparatus 22 mentioned above, the support table 4 of the measuring apparatus 2 is used as a support table for supporting the workpiece 11 and the frame 19 in attaching the adhesive tape 17 thereto. As a modification, the support table (first support table) for supporting the workpiece 11 and the frame 19 in attaching the adhesive tape 17 thereto may be different from the support table (second support table) for supporting the workpiece 11 and the frame 19 in performing the downward amount measuring step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A determining method for determining whether or not the tension of an adhesive tape constituting a frame unit is proper, said frame unit being configured by uniting a plate-shaped workpiece and an annular frame through said adhesive tape, said adhesive tape being composed of a base layer and an adhesive layer formed on said base layer, said workpiece being attached to a central portion of said adhesive layer of said adhesive tape, said frame being attached to a peripheral portion of said adhesive layer of said adhesive tape so as to surround said workpiece in spaced relationship therewith, said determining method comprising:
   a supporting step of supporting said workpiece and said frame in the condition where said base layer of said adhesive tape is exposed upward and a space is defined between said workpiece and said frame below said adhesive tape;
   a downward amount measuring step of placing a weight on said adhesive tape at the position corresponding to said space and then measuring a downward amount corresponding to the tension of said adhesive tape according to the height of said weight with reference to the height of said adhesive tape at the position corresponding to said workpiece and the height of said adhesive tape at the position corresponding to said frame; and
   a determining step of determining that the tension of said adhesive tape is proper when said downward amount falls within a predetermined range, whereas determining that the tension of said adhesive tape is improper when said downward amount falls outside said predetermined range.

2. The determining method according to claim 1, wherein said downward amount is measured at a plurality of positions on said adhesive tape corresponding to said space in said downward amount measuring step; and variations in the tension of said adhesive tape are evaluated according to the difference in said downward amount measured at said plurality of positions in said determining step.

3. The determining method according to claim 1, wherein said weight is a gauge head of a dial gauge.

* * * * *